(12) United States Patent
Hieda

(10) Patent No.: US 6,964,899 B2
(45) Date of Patent: Nov. 15, 2005

(54) SEMICONDUCTOR DEVICE AND METHOD OF MANUFACTURING THE SAME

(75) Inventor: Katsuhiko Hieda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/997,889

(22) Filed: Nov. 29, 2004

(65) Prior Publication Data

US 2005/0087874 A1    Apr. 28, 2005

Related U.S. Application Data

(62) Division of application No. 10/650,852, filed on Aug. 29, 2003.

(30) Foreign Application Priority Data

Apr. 7, 2003    (JP) ............................. 2003-103043

(51) Int. Cl.[7] ................. H01L 21/8242; H01L 27/108
(52) U.S. Cl. .................. 438/243; 438/386; 438/700; 257/302
(58) Field of Search ......................... 438/243, 259, 438/270, 386, 391, 700; 257/301

(56) References Cited

U.S. PATENT DOCUMENTS 5,392,232 A * 2/1995 Kim et al. ................... 365/51

6,642,564 B2 * 11/2003 Ogawa et al. ............... 257/296

FOREIGN PATENT DOCUMENTS

| JP | 4-336464 | 11/1992 |
|---|---|---|
| JP | 6-21340 | 1/1994 |
| JP | 9-283719 | 10/1997 |
| JP | 2000-31434 | 1/2000 |
| JP | 2001-189434 | 7/2001 |
| JP | 2003-23107 | 1/2003 |

OTHER PUBLICATIONS

Notification of Reasons for Rejection (Office Action) for Japanese Patent Application No. 2003-103043, mailed May 10, 2005 and English translation thereof.

* cited by examiner

Primary Examiner—David Nelms
Assistant Examiner—Long Tran
(74) Attorney, Agent, or Firm—Finnegan, Henderson, Farabow, Garrett & Dunner, L.L.P.

(57) ABSTRACT

Disclosed is a semiconductor device having a bit line extending in a first direction, a plurality of transistors electrically connected to the bit line, a plurality of first electrodes arranged in the first direction and electrically connected to the transistors, a dielectric film covering upper and side surfaces of the first electrodes, and a second electrode covering the dielectric film, wherein a width of the first electrode is smaller than a distance between adjacent first electrodes and smaller than the minimum value of design rule of the semiconductor device.

10 Claims, 14 Drawing Sheets

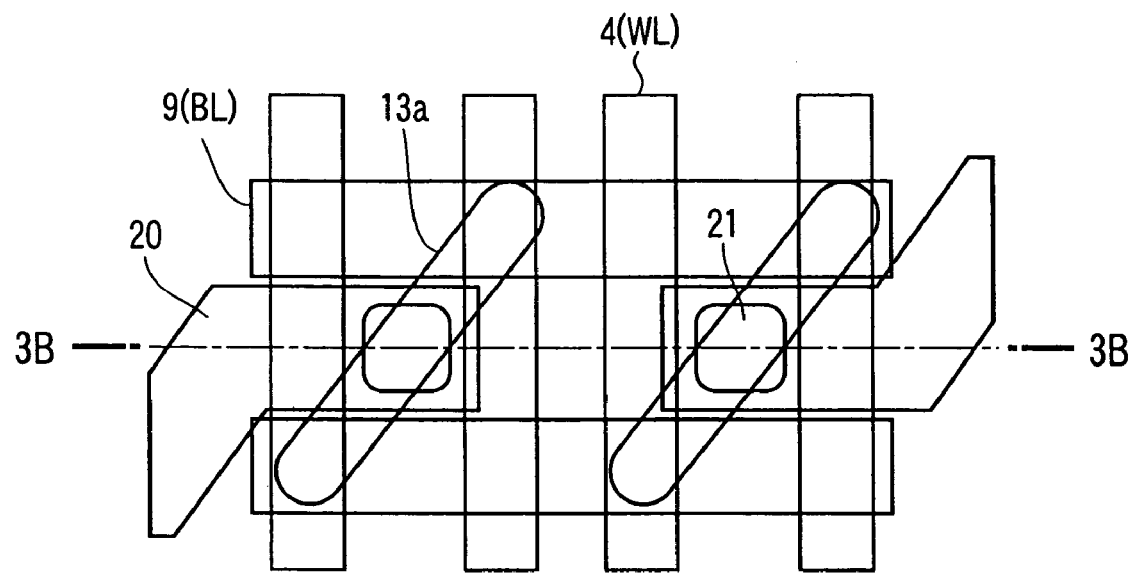
F I G. 3A
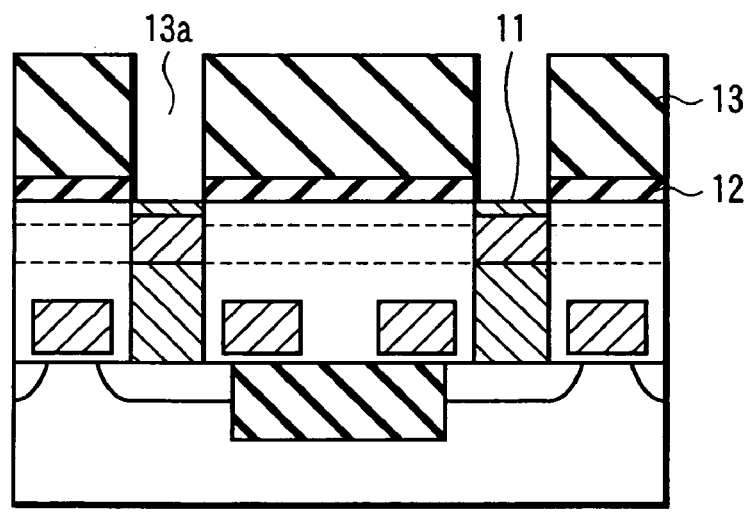
F I G. 3B

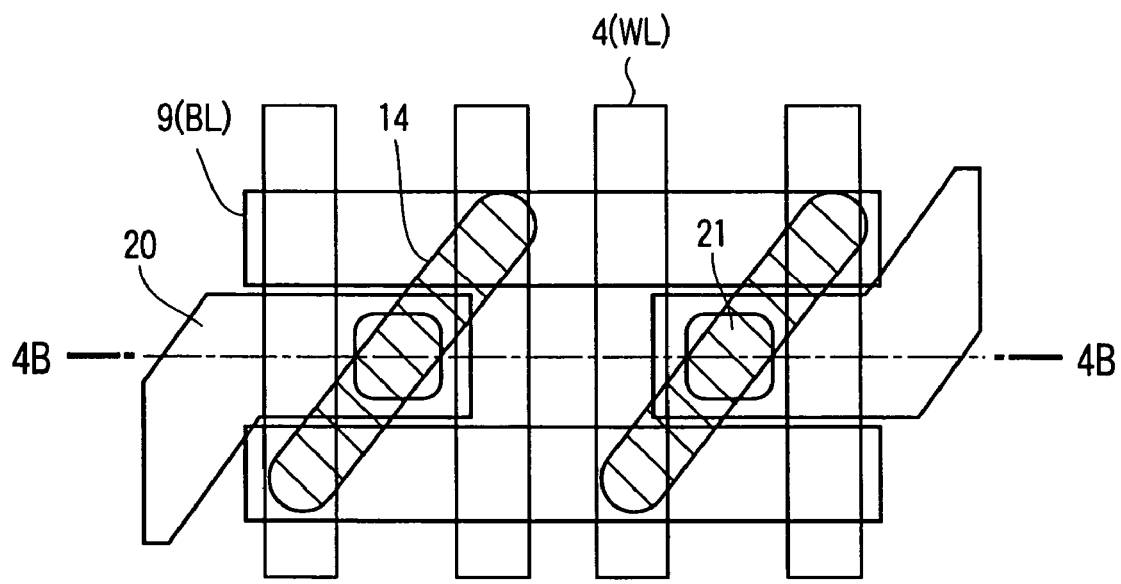
F I G. 4A
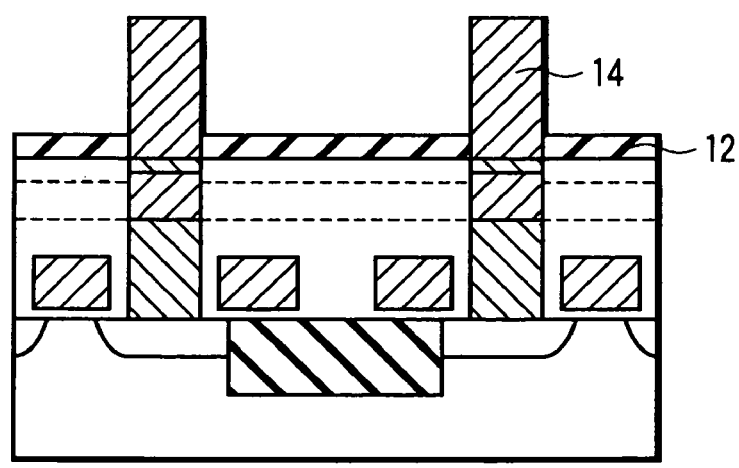
F I G. 4B

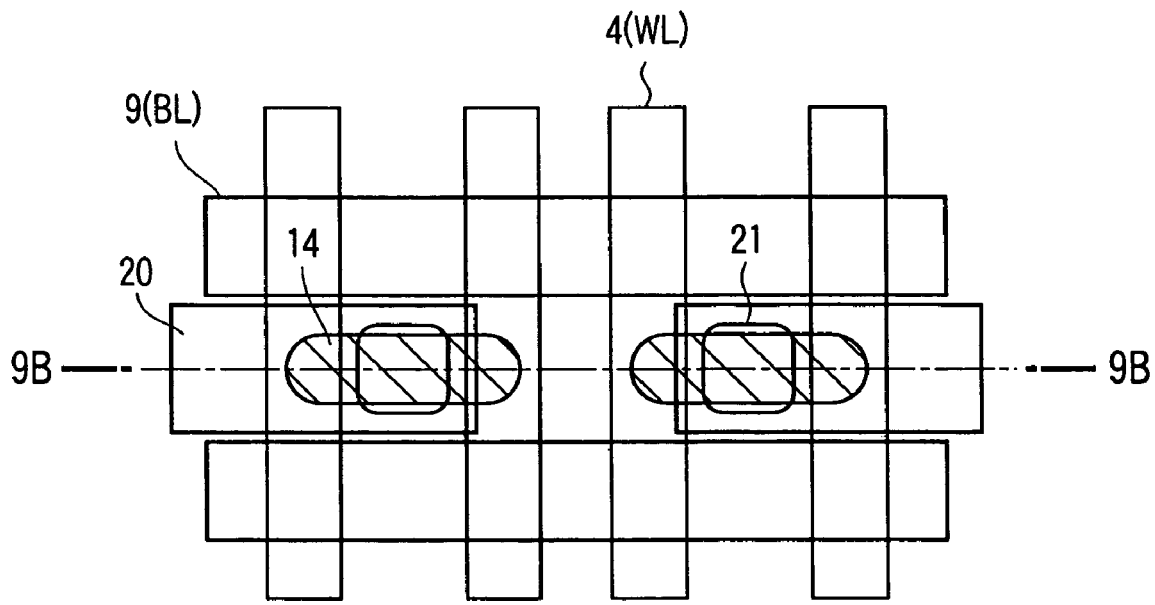
F I G. 9A
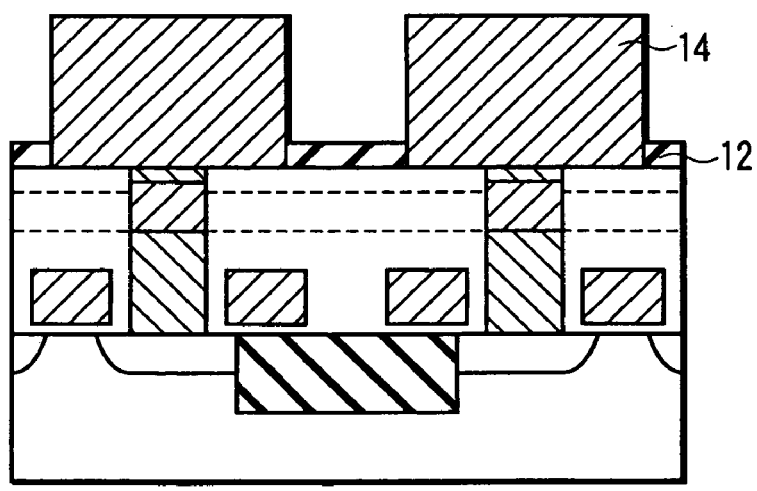
F I G. 9B

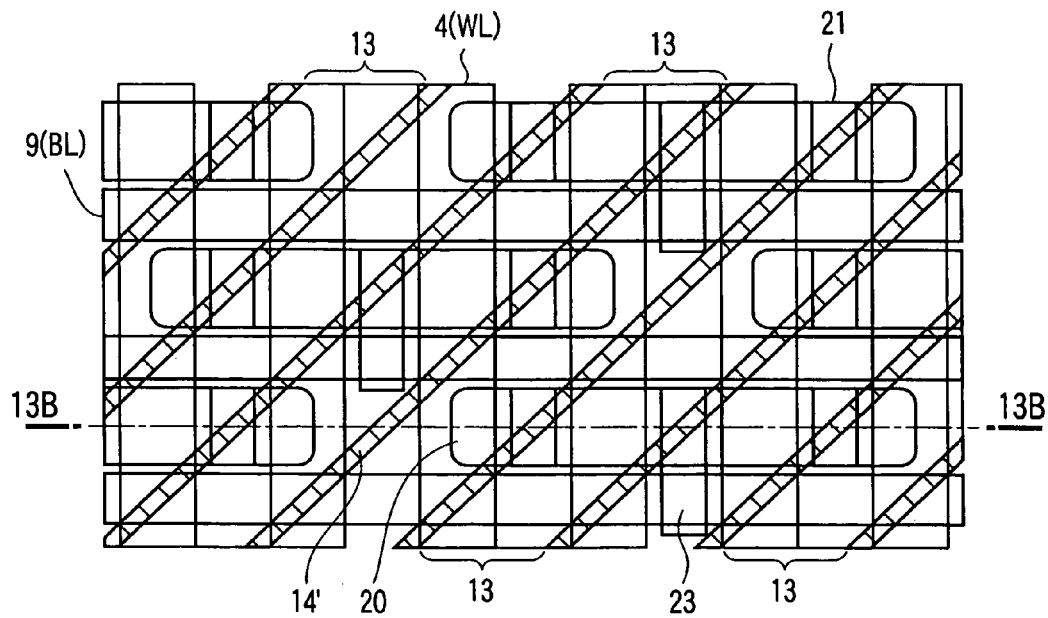
F I G. 13A
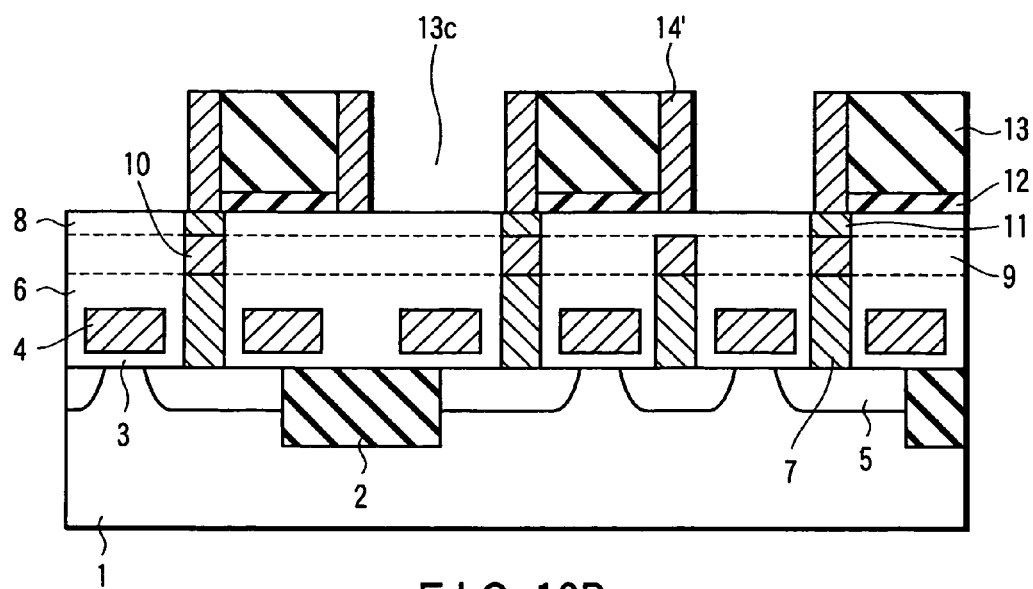
F I G. 13B

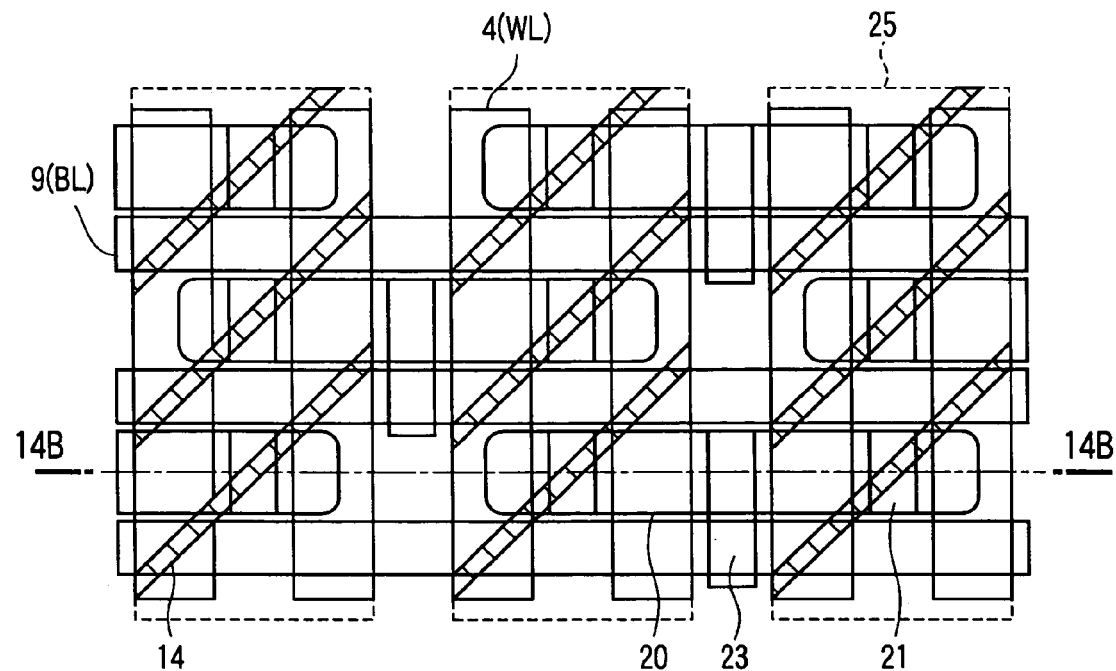
F I G. 14A
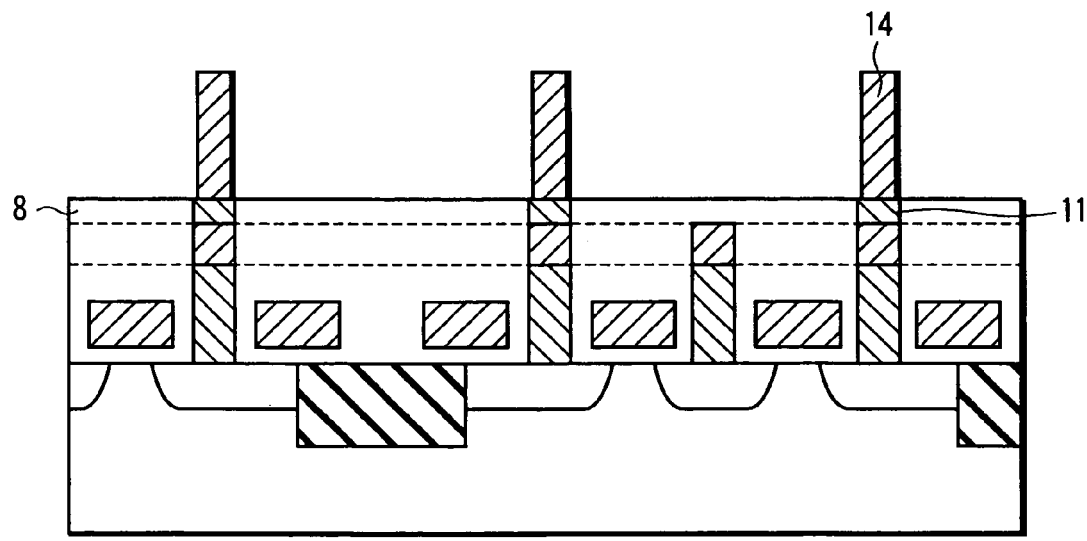
F I G. 14B

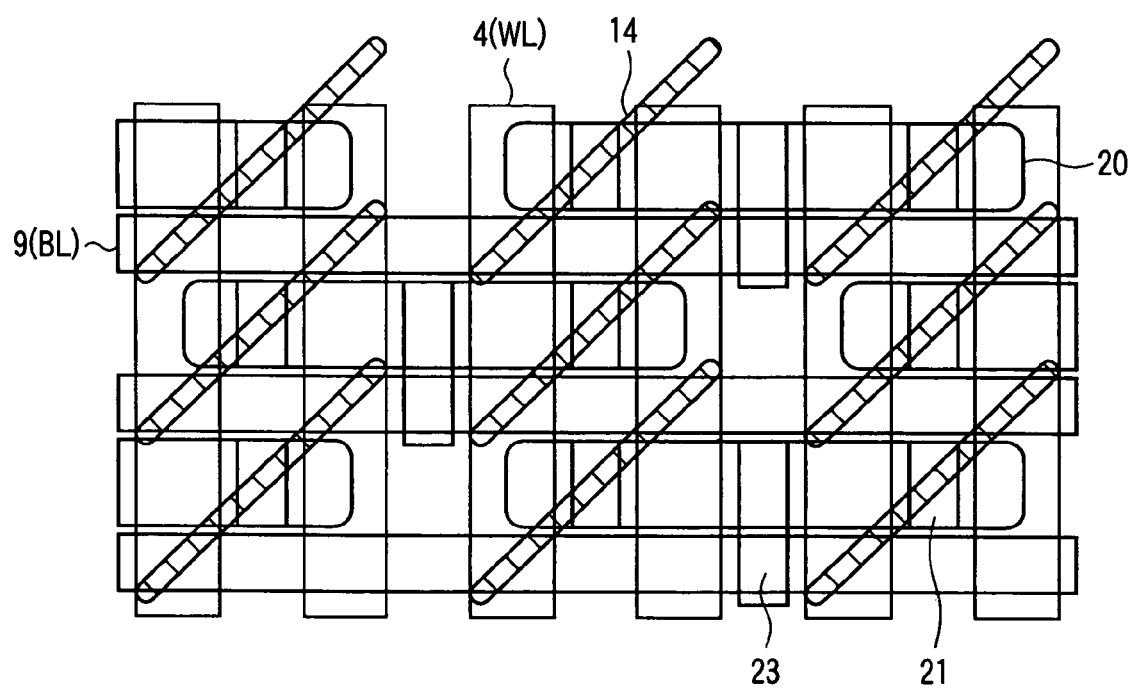
F I G. 15

SEMICONDUCTOR DEVICE AND METHOD OF MANUFACTURING THE SAME

CROSS-REFERENCE TO RELATED APPLICATIONS

This application is a division of application Ser. No. 10/650,852, filed on Aug. 29, 2003, which claims the benefit of priority from prior Japanese Patent Application No. 2003-103043, filed on Apr. 7, 2003. The entire contents of these related applications are incorporated herein by reference.

BACKGROUND OF THE INVENTION

1. Field of the Invention

The present invention relates to a semiconductor device and a method of manufacturing the same.

2. Description of the Related Art

Along with the micro-fabrication and high integration of semiconductor devices, the reduction of memory cell size is advancing. However, the capacitance (storage capacitance: Cs) of capacitors included in the memory cell cannot be too low, in light of sensitivity and soft error.

For this reason, capacitors having a three-dimensional (3D) structure are required. In a 3D structure, a dielectric film is formed to cover upper and side surfaces of a storage node electrode (SN electrode). In addition, a plate electrode (PL electrode) is formed to cover the dielectric film. As described above, the capacitors are formed using the side of the storage node electrode; therefore, the capacitance can be made large even if the memory cell area is reduced.

However, when the reduction of memory cell advances, the space width between adjacent SN electrodes becomes narrow. For this reason, there is a problem that it is difficult to form the dielectric film and the PL electrode in the space between SN electrodes. In general, the width of the SN electrode and the space width between SN electrodes are determined by design rule. When the memory cell area is reduced, the problem described above is very serious.

The following proposal has been made as the conventional technique in JPN. PAT. APPLN. KOKAI Publication No. 2001-189434. According to the proposal, the SN electrode is arranged obliquely to the bit line direction. The structure described above is employed, and thereby, the SN electrode becomes long, that is, the side length of the SN electrode becomes long, so that capacitance can be increased. However, the proposal dose not consider the space width between SN electrodes; therefore, it is impossible to solve the problem described above.

As seen from above, when the memory cell area is reduced, it is difficult to prevent the reduction of capacitance, and to securely form the dielectric film and the PL electrode in the space between SN electrodes. Therefore, it is difficult to obtain a semiconductor device, which includes a capacitor having high reliability and performance.

BRIEF SUMMARY OF THE INVENTION

According to a first aspect of the present invention, there is provided a semiconductor device comprising: a bit line extending in a first direction; a plurality of transistors electrically connected to the bit line; a plurality of first electrodes arranged in the first direction and electrically connected to the transistors; a dielectric film covering upper and side surfaces of the first electrodes; and a second electrode covering the dielectric film, wherein a width of the first electrode is smaller than a distance between adjacent first electrodes and smaller than the minimum value of design rule of the semiconductor device.

According to a second aspect of the present invention, there is provided a method of manufacturing a semiconductor device, comprising: forming a first film on a substrate including a bit line extending in a first direction and a plurality of transistors electrically connected to the bit line; patterning the first film to form a plurality of trenches; forming second films on side surfaces of the trenches to narrow the trenches; forming, in the narrowed trenches, a plurality of first electrodes arranged in the first direction and electrically connected to the transistors; removing the first film and the second films; forming a dielectric film covering upper and side surfaces of the first electrodes; and forming a second electrode covering the dielectric film.

According to a third aspect of the present invention, there is provided a method of manufacturing a semiconductor device, comprising: forming a first film on a substrate including a bit line extending in a first direction and a plurality of transistors electrically connected to the bit line; patterning the first film to form a plurality of trenches; forming second films made of conductive material on side surfaces of the trenches; removing the first film; patterning the second films to form a plurality of first electrodes arranged in the first direction and electrically connected to the transistors; forming a dielectric film covering upper and side surfaces of the first electrodes; and forming a second electrode covering the dielectric film.

BRIEF DESCRIPTION OF THE SEVERAL VIEWS OF THE DRAWING

FIG. 3A and FIG. 3B are views schematically showing part of the process of manufacturing the semiconductor device according to the first embodiment of the present invention;

FIG. 4A and FIG. 4B are views schematically showing part of the process of manufacturing the semiconductor device according to the first embodiment of the present invention;

FIG. 9A and FIG. 9B are views schematically showing part of the process of manufacturing the semiconductor device according to the second embodiment of the present invention;

FIG. 13A and FIG. 13B are views schematically showing part of the process of manufacturing a semiconductor device according to a fourth embodiment of the present invention;

FIG. 14A and FIG. 14B are views schematically showing part of the process of manufacturing the semiconductor device according to the fourth embodiment of the present invention; and FIG. 15 is a view schematically showing a modification example of the fourth embodiment of the present invention.

DETAILED DESCRIPTION OF THE INVENTION

Embodiments of the present invention will be described below with reference to the accompanying drawings.

(First Embodiment)

Figure 1A:
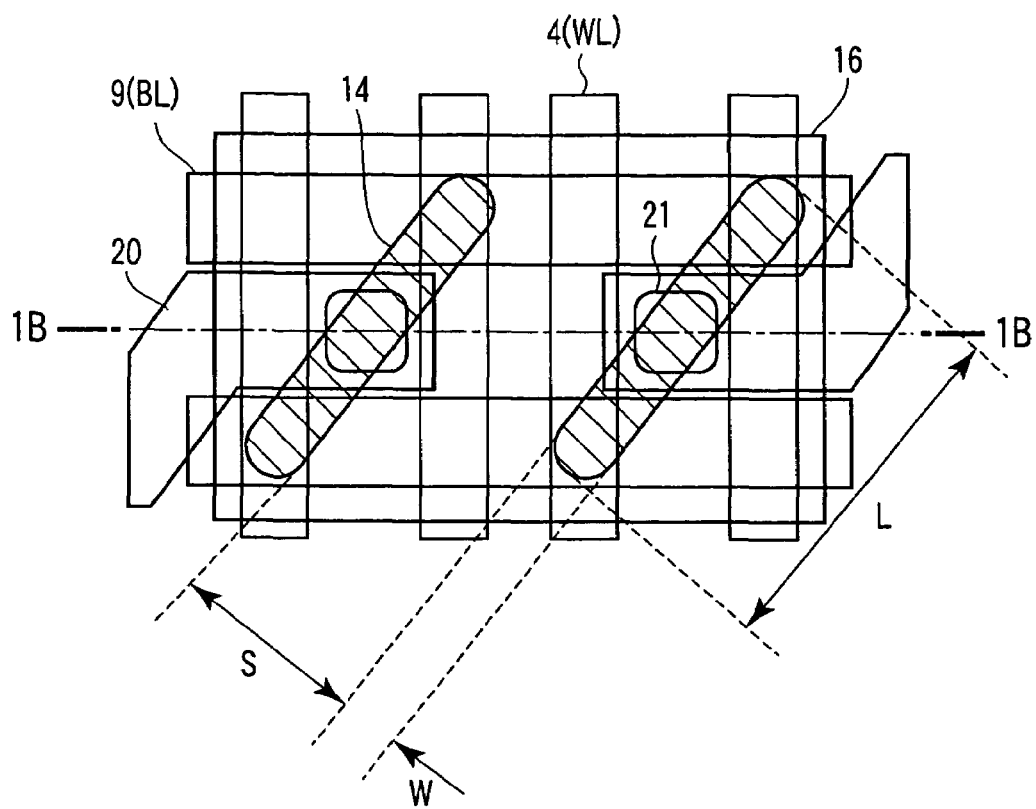
FIG. 1A and FIG. 1B are views schematically showing the structure of a semiconductor device according to a first embodiment of the present invention.
Figure 1B:
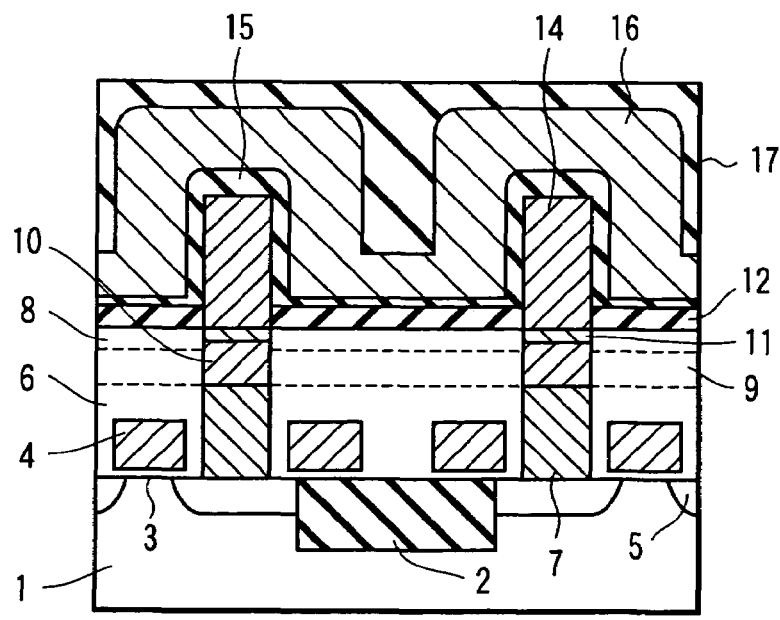

FIG. 1A and FIG. 1B are views schematically showing the structure of a memory cell and the vicinity in a semiconductor device (stacked DRAM) according to a first embodiment of the present invention. FIG. 1A is a plan view, and FIG. 1B is a cross-sectional view taken along a line B—B of FIG. 1A.

A semiconductor substrate (silicon substrate) 1 is formed with an isolation region 2. A MIS transistor is formed in an element region 20 surrounded by the isolation region 2. The MIS transistor has a gate insulating film 3, a gate electrode 4 and a source/drain diffusion layer 5. The gate electrode 4 constitutes part of a word line (WL). The MIS transistor is covered with an interlayer dielectric film 6. An interlayer dielectric film 8 is formed on the interlayer dielectric film 6, and further, a silicon nitride film (SiN film) 12 is formed on the interlayer dielectric film 8.

A polysilicon plug 7 connected to one of the source/drain diffusion layers 5 is formed in the interlayer dielectric film 6. A tungsten (W) plug 10 is formed on the polysilicon plug 7, and a barrier film 11 is formed on the tungsten plug 10. A bit line 9 is formed in the interlayer dielectric film 8. The bit line 9 is connected to the other of the source/drain diffusion layers 5 via bit line contact (BL contact (not shown). The polysilicon plug 7, tungsten plug 10 and barrier film 11 shown in FIG. 1B are corresponding to an SN contact 21 shown in FIG. 1A.

SN electrodes (storage node electrodes) 14 are formed on the barrier film 11. The SN electrodes 14 are arranged in a direction parallel to the extending direction of the bit line 9 in a state of separating from each other. The upper surface and the side surface of each SN electrode 14 are covered with a dielectric film 15, and the dielectric film 15 is covered with a plate electrode (PL electrode) 16. The dielectric film 15 and the plate electrode 16 have a portion formed between adjacent SN electrodes 14 in addition to the portion covering the SN electrode 14. Each capacitor formed of the SN electrode 14, dielectric film 15 and plate electrode 16 is covered with an interlayer dielectric film 17.

In the embodiment of the semiconductor device, the distance (space width S) between adjacent SN electrodes 14 is wider than the width W of the SN electrode 14, as shown in FIG. 1A. In this case, the width W corresponds to the shorter side of the SN electrode 14, and the length L corresponds to the longer side thereof. More specifically, the width W of the SN electrode 14 is smaller than the minimum value of the design rule applied to the semiconductor device, and the space width S is larger than the minimum value of the design rule applied to the semiconductor device. Usually, the minimum width of the bit line corresponds to the minimum value of the design rule. In the embodiment, the SN electrode 14 is inclined to the extending direction of the bit line 9. That is, an angle defined by the line parallel to the extending direction of the bit line 9 and the line parallel to the longitudinal direction of the SN electrode 14 is larger than 0° and smaller than 90°. In the example shown in FIG. 1A, the angle is 45°. The width W of the SN electrode 14 is smaller than the height of the SN electrode 14.

As described above, according to the embodiment, the space width S between SN electrodes is wider than the width W of the SN electrode. Thus, even if a memory cell is reduced, it is possible to securely form the dielectric film and the PL electrode in the space between SN electrodes. In addition, the SN electrode is inclined to the extending direction of the bit line, so that the SN electrodes can be effectively arranged in the limited area. For example, if the inclined angle is 45°, the length L of the SN electrode is set to about 1.4 times as much as the case where the longitudinal direction of the SN electrode and the extending direction of the bit line are parallel. Therefore, the capacitance based on the side surface of the SN electrode can be increased. Consequently, according to the embodiment, it is possible to secure high reliability and performance of the capacitor even if the memory cell is reduced.

The process of manufacturing the semiconductor device shown in FIG. 1A and FIG. 1B will be described below with reference to FIG. 2A and FIG. 2B to FIG. 4A and FIG. 4B. Here, 70 nm design rule generation is given as an example. Likewise, other generations are possible. In addition, an N-channel MIS transistor is used as the memory cell. Likewise, a p-channel MIS transistor may be used as the memory cell.

Figure 2A:
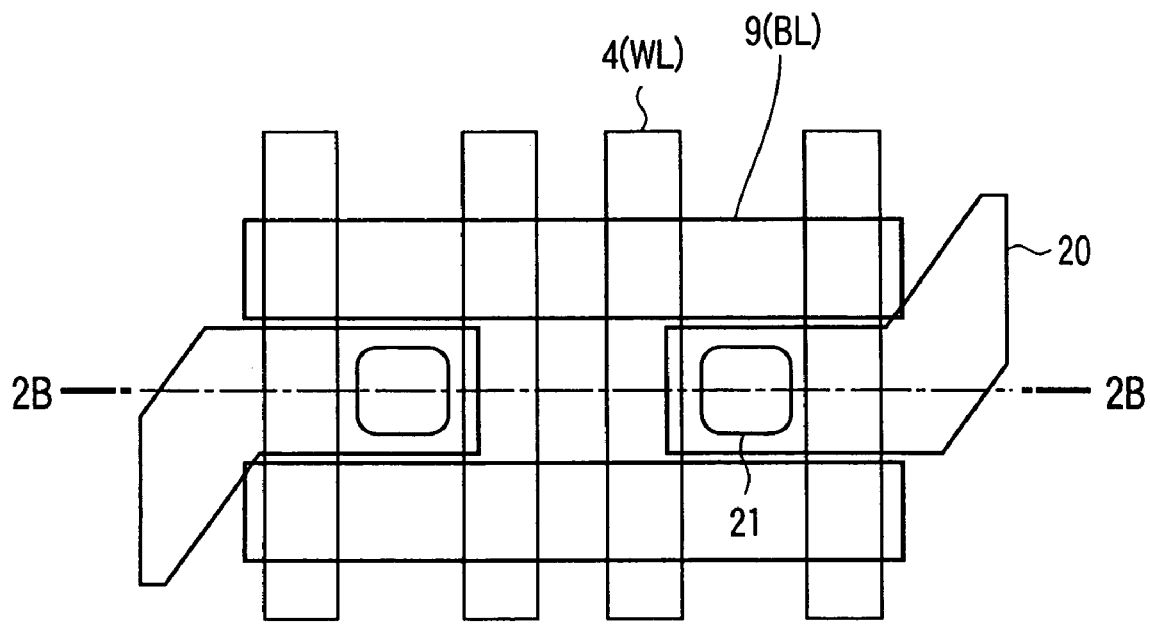
FIG. 2A and FIG. 2B are views schematically showing part of the process of manufacturing the semiconductor device according to the first embodiment of the present invention.
Figure 2B:
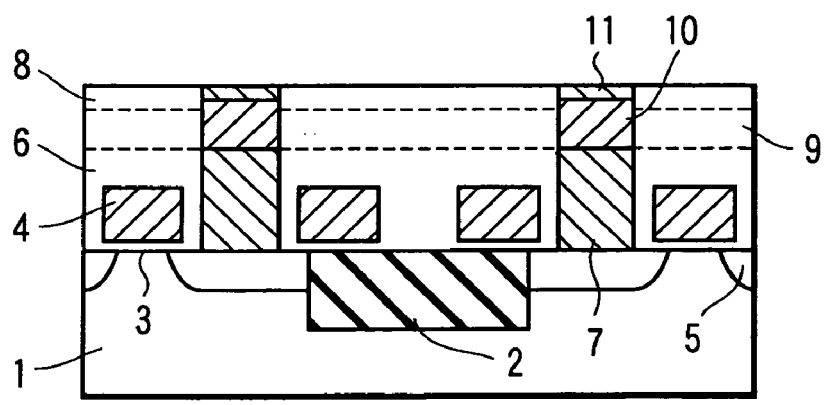

As shown in FIG. 2A and FIG. 2B, the silicon substrate 1 is formed with a trench using reactive ion etching (RIE). The depth of the trench is 0.3 μm, for example. The trench is buried with an insulating film so that a STI (Shallow Trench Isolation) region 2 can be formed.

A silicon oxide film having a thickness of about 5 nm is formed on the silicon substrate 1 as the gate insulating film. An electrode film for the gate electrode 4 is formed on the gate insulating film. A gate cap film (not shown) functioning as etching stopper is formed on the electrode film. Silicon nitride film ($Si_3N_4$ film) may be used as the gate cap film. Thereafter, a resist pattern (not shown) is formed on the gate cap film, and then, the gate cap film is etched using the resist pattern as a mask. The electrode film is etched using the gate cap film as a mask so that the gate electrode 4 can be formed. The gate electrode 4 functions as a word line (WL) in the memory cell region. In this case, the polycide structure may be applied to the gate electrode 4 in order to reduce the resistance. A stacked film of polysilicon film (thickness of about 50 nm) and $WSi_2$ film (thickness of about 50 nm) may be used as the polycide structure. In addition, the poly-metal structure (e.g., stacked film of polysilicon film and tungsten film) may be used. A single polysilicon film may be used as the gate electrode 4.

In order to improve the breakdown voltage between gate electrode and impurity diffusion layer, RTO (Rapid Thermal Oxidation) is carried out under an oxygen atmosphere at the temperature of 1050° C. for about 100 seconds. By doing so, a so-called post oxide film (not shown) is formed. Thereafter, the source/drain diffusion layer 5 having low impurity concentration is formed by ion implantation using the resist pattern (not shown) and the gate electrode 4 as a mask. A silicon nitride film (thickness: about 20 nm, not shown) is deposited on the entire surface by LP-CVD process. Thereafter, the silicon nitride film is etched by RIE so that a sidewall spacer film can be formed on the side surface of the gate electrode 4. The source/drain diffusion layer having high impurity concentration is formed by ion implantation using a resist pattern, the sidewall spacer, and the gate electrode 4 as a mask.

A silicon nitride film (thickness: about 20 nm, not shown) is deposited on the entire surface as stopper film by LP-CVD process. Further, by a CVD process, a BPSG film is deposited on the entire surface by about 500 nm as the interlayer dielectric film 6. The surface of the interlayer dielectric film 6 is planarized by CMP. In this case, the interlayer dielectric film 6 on the gate cap film has a thickness of about 100 nm. The substantially entire surface of the wafer is planarized by CPM.

The interlayer dielectric film 6 is formed with contact holes using a self-align process in order to make connections between the source/drain diffusion layer 5 and the bit line and between the source/drain diffusion layer 5 and the SN electrode. High selective ratio RIE is used as etching for forming the contact holes such that the etching rate of the BPSG film is ten times as much as that of the silicon nitride film (stopper film). By doing so, it is possible to prevent short circuit of the gate electrode and the polysilicon plug 7 formed in the contact hole; therefore, product yield can be improved.

A polysilicon film (n+ polysilicon film) doped with phosphorus (P), or arsenic (As) as an impurity is deposited on the entire surface by LP-CVD. The polysilicon film buries the contact hole. The polysilicon films other than the contact hole are removed by CMP or etch back so that the polysilicon plug 7 can be formed. The polysilicon plug 7 is connected to the source/drain diffusion layer 5, and functions as SN contact and BL contact.

The BPSG film is deposited on the entire surface as the interlayer dielectric film 8 by CVD to have a thickness of about 300 nm. A TEOS oxide film (thickness: about 100 nm, not shown) is deposited on the interlayer dielectric film 8 as etching stopper of CMP by CVD. Using a dual damascene process, the bit line 9 is formed in the following manner. That is, the BPSG film 8 and the TEOS oxide film are formed with a trench for a bit line. A contact hole (not shown) reaching the BL contact polysilicon plug is formed. A conductive film (e.g., stacked film of W/TiN/Ti) is buried in the trench and the contact hole, and thereby, the bit line 9 connected to the polysilicon plug is formed.

The conductive film (W film, etc.) buried in the trench is etched by about 100 nm. A silicon nitride film (not shown) is deposited on the entire surface to have a thickness of about 300 nm. Excess silicon nitride film is removed by CMP or CDE (Chemical Dry Etching) so that the silicon nitride film remains only on the conductive film functioning as a bit line.

Before forming conductive film, the peripheral circuit region may be formed with trench and contact hole. By doing so, a contact plug (not shown) can be simultaneously formed in the peripheral circuit region when forming the bit line.

Using normal lithography and RIE, the BPSG film 8 and the TEOS oxide film are formed with a contact hole reaching the polysilicon plug 7 (SN plug). A conductive film (e.g., stacked film of W/TiN/Ti) is deposited on the entire surface so that the conductive film can bury the contact hole. Excess conductive film on the interlayer dielectric film is removed by CMP so that the conductive film remains only in the contact hole. By doing so, a plug 10 (hereinafter, referred to as W plug) formed of the conductive film (stacked film of W/TiN/Ti) is formed. The W plug 10 is electrically connected to the source/drain diffusion layer 5 via the polysilicon plug 7 (SN plug). In this case, the contact hole may be formed in the region between bit lines using the silicon nitride film (not shown) on the bit line 9 and resist (not shown). In this stage, both memory cell region and peripheral circuit region (not shown) are planarized.

The surface of the W plug 10 is etched by about 100 nm so that a recess can be formed. A TiN film is buried in the formed recess as a barrier metal film 11.

As illustrated in FIG. 3A and FIG. 3B, a silicon nitride film 12 having a thickness of about 50 nm is formed on the entire surface. Further, a plasma TEOS oxide film 13 is deposited to have a thickness of about 400 nm. The TEOS oxide film 13 and the silicon nitride film 12 are etched by RIE using resist pattern (not shown) as a mask so that the barrier metal film 11 can be exposed. By doing so, a trench 13a for the SN electrode is formed. The width of the trench 13a is set to become narrower than the distance (space width) between adjacent trenches 13a. When the TEOS oxide film 13 is etched using a resist as a mask, the trench width becomes narrow by the influence of deposits resulting from the resist in etching. According to the embodiment, the phenomenon described above is used, thereby forming a trench having a width narrower than the minimum width determined by design rule. It is noted that the side surface of the trench 13a has a tendency to be tapered; however, the etching conditions are controlled, and thereby, a substantially vertical side surface may be formed.

As seen from FIG. 4A and FIG. 4B, after the resist is removed, a Ru film for an SN electrode is deposited on the entire surface to a thickness of about 100 nm, by CVD. Thereafter, the Ru film is planarized using CMP or etch back process. By doing so, the Ru film is buried only in trench 13a, and thus, the SN electrode 14 having a width narrower than the minimum width determined by design rule is formed. Here, the Ru film is used as the SN electrode material. In this case, $RuO_2$, Pt, Re, Os, Pd, Rh, Au, Ir and $IrO_2$ films or metal oxide films (e.g., SRO ($SrRuO_3$) having a perovskite structure may be used. In addition, films stuffing a metal film grain with another metal film (e.g., Rh or Ir) may be used.

The peripheral circuit region and the like are covered with a resist (not shown). By using the resist as a mask, the TEOS oxide film 13 is etched using a wet etching solution, such as $NH_4F$ or a combination of RIE and wet etching. In this case, the silicon nitride film 12 under the TEOS oxide film 13 is used as an etching stopper. By doing so, the height of the SN electrode surface in the memory cell region is flush with the height of the TEOS oxide film surface other than the memory cell region. As a result, it is possible to prevent a step from being formed between the memory cell region and the region other than that resulting from the presence or not of the SN electrode. Incidentally, the TEOS oxide film 13 on the entire surface of the wafer may be removed. In this case, a step is formed between the memory cell region and the peripheral circuit region; however, an oxide film is deposited in the process after that, and the step is planarized by CMP.

The side shape of the SN electrode 14 thus obtained corresponds to that of the trench 13a formed in the TEOS oxide film 13. If a metal film, such as a W film is etched to form the SN electrode 14, it is very difficult to control the etching, and to obtain a smooth side surface. In the embodiment, the trench 13a is formed in the oxide film 13, which is easily etched, and a metal film such as a W film is buried in the trench 13a, and thus, the SN electrode 14 is formed. Therefore, the SN electrode 14 having a smooth side surface is obtained. By doing so, it is possible to prevent the increase of the leakage current of the capacitor insulating film resulting from roughness of the side surface of the SN electrode.

As shown in FIG. 1A and FIG. 1B, a $Ta_2O_5$ film is deposited on the entire surface as the capacitor dielectric film 15 by CVD to a thickness of about 12 nm. The Ru film 16 for the plate (PL) electrode is deposited on the entire surface by CVD to a thickness of about 40 nm. TiN film is formed on the entire surface as a cap film (not shown) by sputtering to a thickness of about 50 nm. Thereafter, the Ru film and the cap film are patterned using normal lithography and RIE processes. By doing so, a capacitor formed of SN electrode 14, dielectric film 15 and plate electrode 16 is obtained.

In the embodiment, the Ru film is used as the plate electrode 16; however, the following films may be used. The films include noble metal films such as Pt, Re, Ir, Os, Pd, Rh and Au films, noble metal oxide films, metal oxide films such as SRO having a perovskite structure, TiON film, TiN film, TaN film, etc. In addition, it is preferable to use metal oxide films as the capacitor dielectric film 15. More specifically, high dielectric constant films such as (Ba, Sr) $TiO_3$ (BST film), $SrTiO_3$, $Ta_2O_5$ and $Al_2O_3$ having a dielectric constant higher than silicon oxide films may be used. A stacked film of the high dielectric constant films described above may be used.

After the interlayer dielectric film is deposited, although not illustrated, a contact hole is formed, and further, metal interconnect lines are formed. If necessary, the contact hole and metal interconnect lines may be formed in several layers. Further, passivation film and pad contact are formed, and thus, a DRAM is completed.

Figure 5:
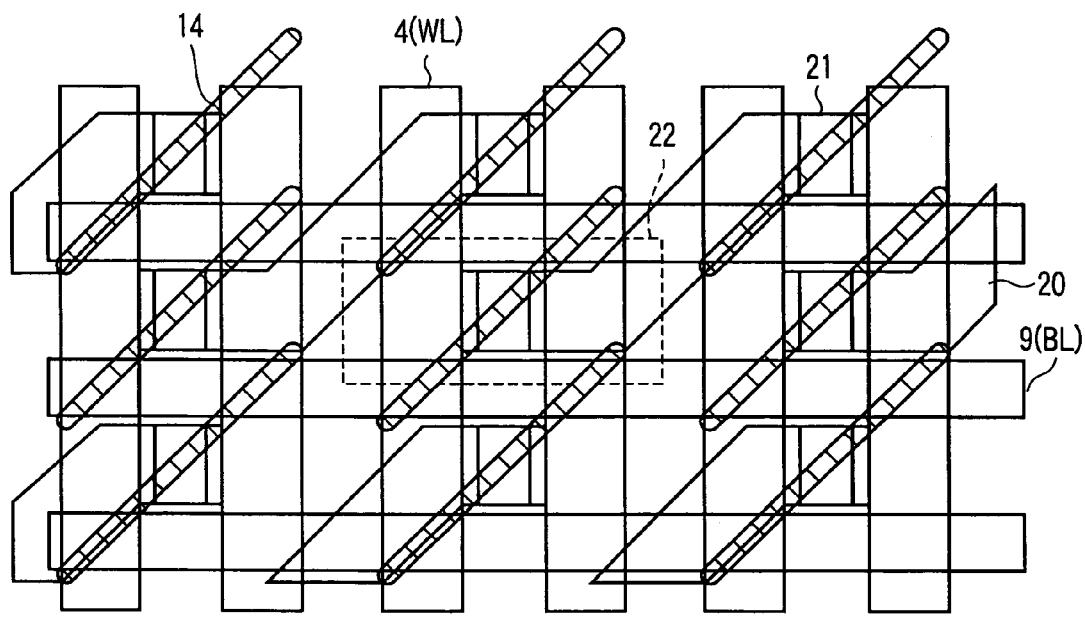
FIG. 5 is a view schematically showing a layout example of memory cell in the first embodiment of the present invention.

FIG. 5 is a view schematically showing a layout example of a memory cell region in the first embodiment. As seen from FIG. 5, one SN electrode 14 is arranged correspondingly to one memory cell 22. In addition, the SN electrode 14 is inclined at an angle of 45° to the extending direction of the bit line 9. The SN electrode 14 and one of the source/drain diffusion layers 5 are connected via a SN contact 21, and the bit line 9 and the other of the source/drain diffusion layers 5 are connected via a BL contact 23.

According to the embodiment, the distance (space width) between SN electrodes is wider than the width of the SN electrode. In addition, the SN electrode is inclined in the extending direction of the bit line. Therefore, even if the memory cell area is made small, it is possible to prevent the reduction of capacitance, and to securely form the dielectric film and the plate electrode in the space between SN electrodes. As a result, the capacitor can secure high reliability and performance.

(Second Embodiment)

Figure 6A:
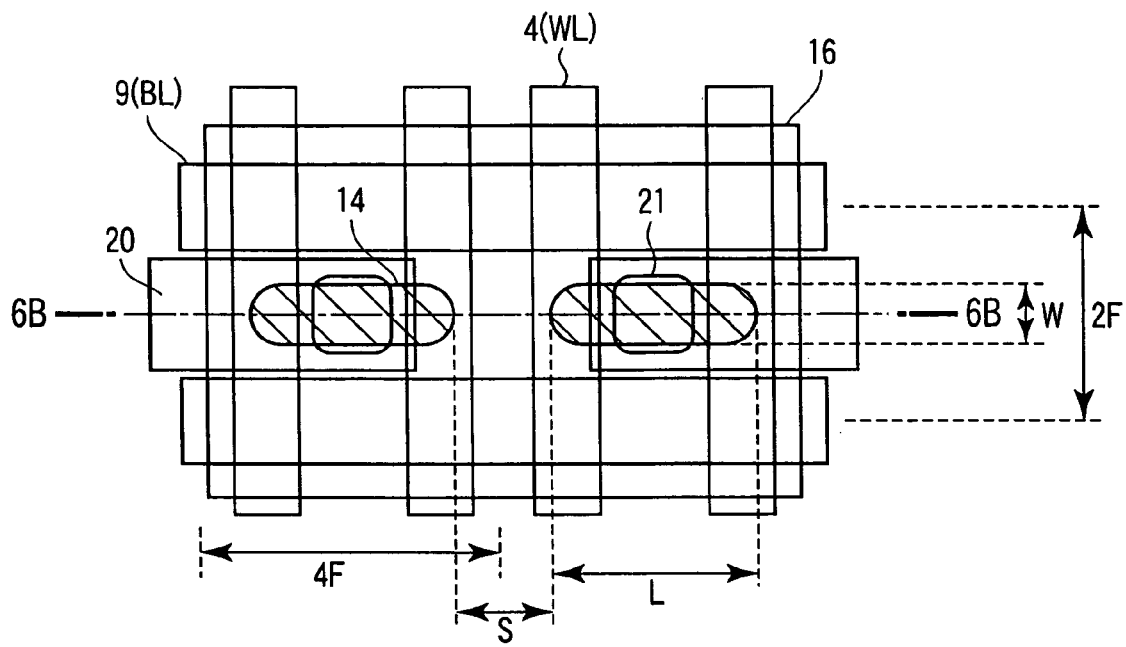
FIG. 6A and FIG. 6B are views schematically showing the structure of a semiconductor device according to a second embodiment of the present invention.
Figure 6B:
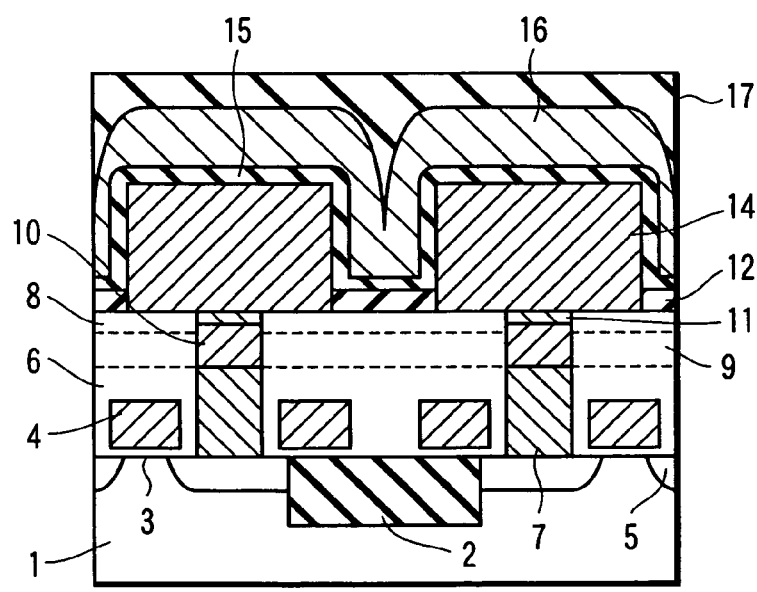

FIG. 6A and FIG. 6B are views schematically showing the structure of a memory cell and the vicinity in a semiconductor device (stacked DRAM) according to a second embodiment of the present invention. FIG. 6A is a plan view, and FIG. 6B is a cross-sectional view taken along a line B—B of FIG. 6A. The semiconductor device of the second embodiment has basically the same structure as the first embodiment. Identical reference numerals are used to designate elements corresponding to those described in the first embodiment, and the details are omitted.

In the embodiment of the semiconductor device, an $8F^2$ type memory cell structure having one memory cell size of 4F×2F is employed; in this case, F is the feature size. In the embodiment, the distance (space width S) between adjacent SN electrodes 14 is wider than the width of the SN electrode 14 as seen from FIG. 6A, like the first embodiment. More specifically, the width W of the SN electrode 14 is narrower than the minimum value of the design rule (corresponding to a half pitch and the design rule of line and space in DRAM) applied to the semiconductor device, and the space width S is wider than the minimum value of the design rule.

Therefore, even if the longitudinal direction of the SN electrode 14 is parallel to the extending direction of the bit line 9, it is possible to securely form the dielectric film 15 and the plate electrode 16 in the space between SN electrodes. Thus, even if the memory cell is reduced, the capacitor can secure a high reliability and performance, like the first embodiment.

The process of manufacturing the semiconductor device shown in FIG. 6A and FIG. 6B will be described below with reference to FIG. 7A and FIG. 7B to FIG. 9A and FIG. 9B. The process of manufacturing the semiconductor device is basically the same as the first embodiment; therefore, the details are given by referring to the first embodiment. The outline of the process will be described herein.

Figure 7A:
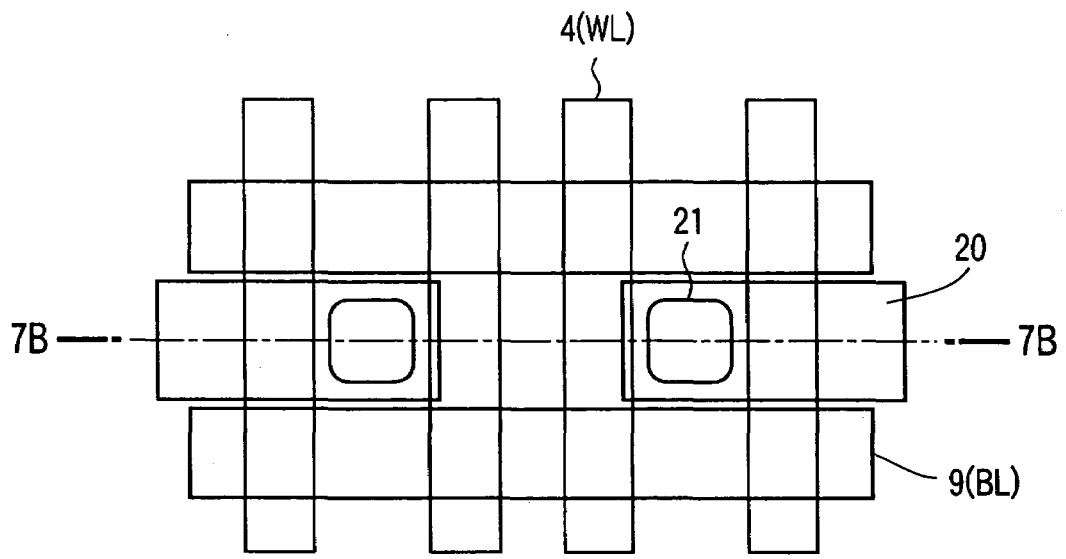
FIG. 7A and FIG. 7B are views schematically showing part of the process of manufacturing the semiconductor device according to the second embodiment of the present invention.
Figure 7B:
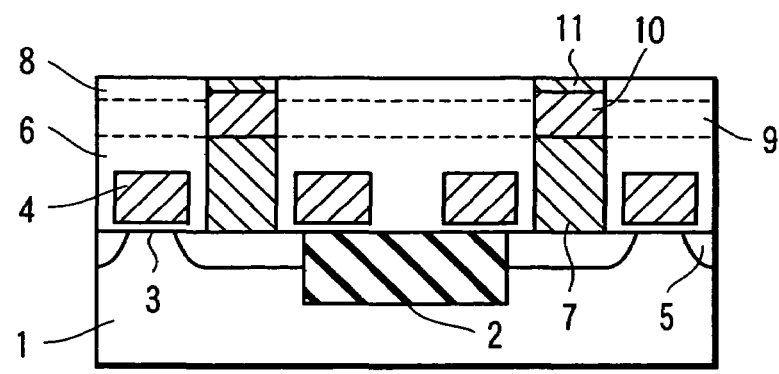

As shown in FIG. 7A and FIG. 7B, the silicon substrate 1 is formed with the STI region 2, like the first embodiment. The gate insulating film 3 and the gate electrode 4 (word line) are formed on the silicon substrate 1, and further, the source/drain diffusion layer 5 is formed. The interlayer dielectric film 6 and the polysilicon plug 7 are formed, and further, the interlayer dielectric film 8 and the bit line 9 are formed. In addition, the W plug 10 and the barrier metal film 11 are formed.

Figure 8A:
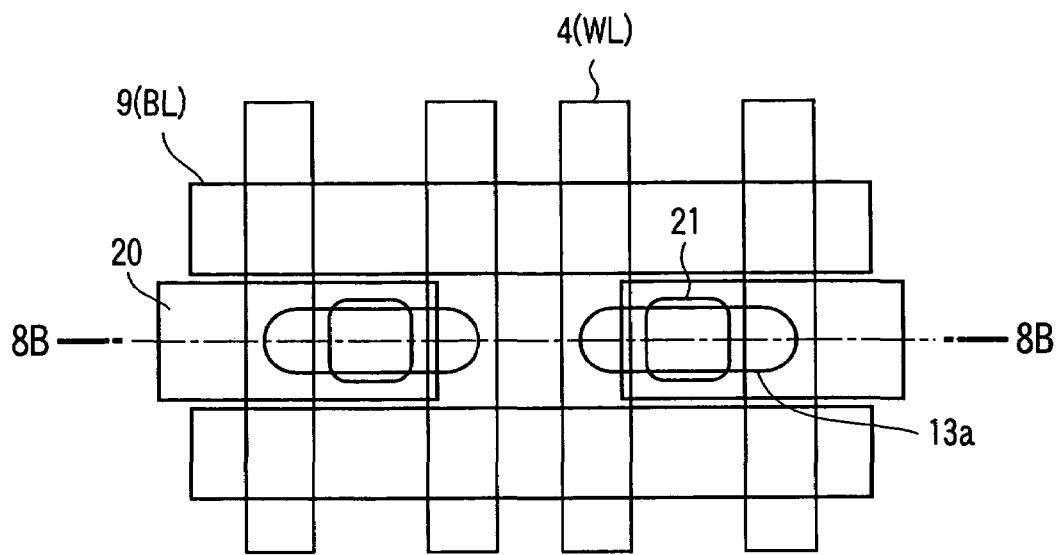
FIG. 8A and FIG. 8B are views schematically showing part of the process of manufacturing the semiconductor device according to the second embodiment of the present invention.
Figure 8B:
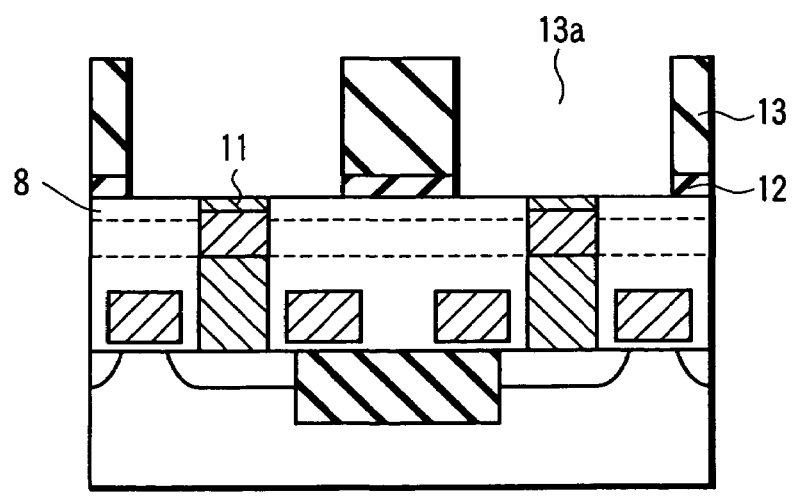

As illustrated in FIG. 8A and FIG. 8B, the silicon nitride film 12 and the TEOS oxide film 13 are formed, and further, the trench 13a for the SN electrode is formed, like the first embodiment. In this case, the width of the trench 13a is set wider than the distance between adjacent trenches 13a by the same method as described in the first embodiment.

As seen from FIG. 9A and FIG. 9B, the SN electrode 14 is formed in the trench 13a, and the TEOS oxide film 13 is removed by etching.

As depicted in FIG. 6A and FIG. 6B, capacitor dielectric film 15 and plate (PL) electrode 16 are formed. By doing so, a capacitor formed of SN electrode 14, dielectric film 15 and plate (PL) electrode 16 is obtained.

Figure 10:
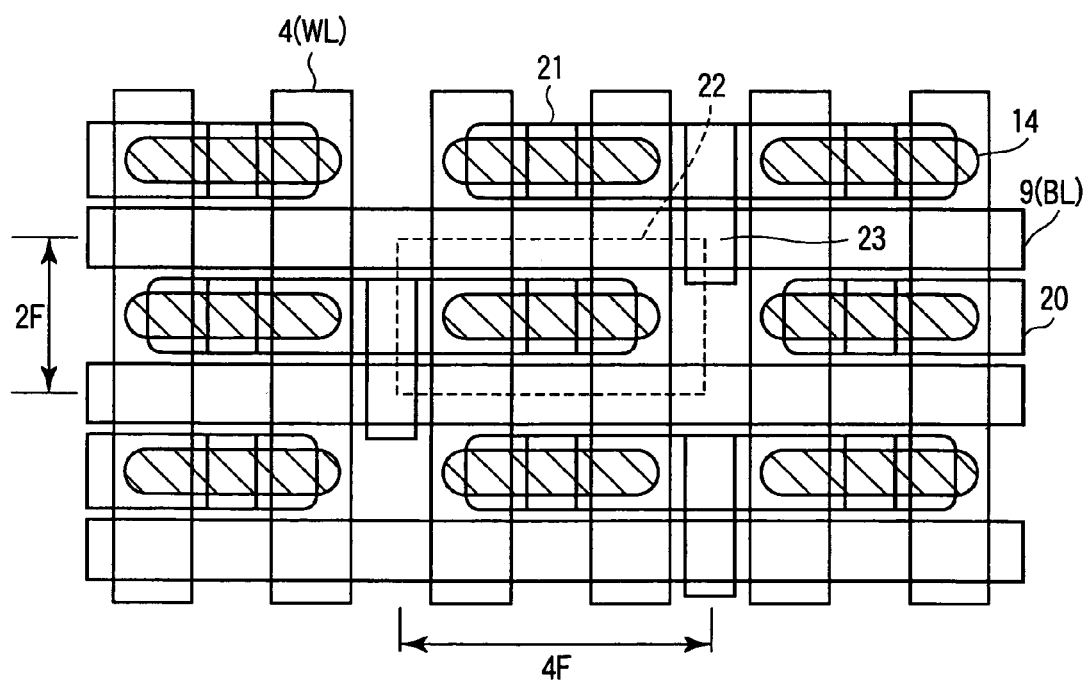
FIG. 10 is a view schematically showing a layout example of memory cell in the second embodiment of the present invention.

FIG. 10 is a view schematically showing a layout example of a memory cell region in the second embodiment. As seen from FIG. 10, one SN electrode 14 is arranged correspondingly to one memory cell 22. In addition, the SN electrode 14 and one of the source/drain diffusion layers 5 are connected via a SN contact 21, and the bit line 9, and the other of the source/drain diffusion layers 5 are connected via a BL contact 23.

According to the embodiment, the distance (space width) between SN electrodes is wider than the width of the SN electrode, like the first embodiment. Therefore, even if the memory cell size is determined by line and space design rule like the $8F^2$ type memory cell, it is possible to prevent the reduction of capacitance, and to securely form the dielectric film and the plate electrode in the space between SN electrodes. As a result, the capacitor can secure high reliability and performance.

(Third Embodiment)

The process of manufacturing in a semiconductor device (stacked DRAM) according to a third embodiment of the present invention will be described below with reference to FIG. 11A and FIG. 11B to FIG. 12A and FIG. 12B. The semiconductor device of the third embodiment has basically the same structure as the first embodiment. The identical reference numerals are used to designate elements corresponding to those described in the first embodiment, and the details are omitted. In addition, the process of manufacturing the semiconductor device is basically the same as the first embodiment; therefore, the details are given by referring to the first embodiment. The particular process according to the second embodiment will be mainly described herein.

The process up to formation of the barrier metal film 11 is carried out like the process described in FIG. 2A and FIG. 2B of the first embodiment.

Figure 11A:
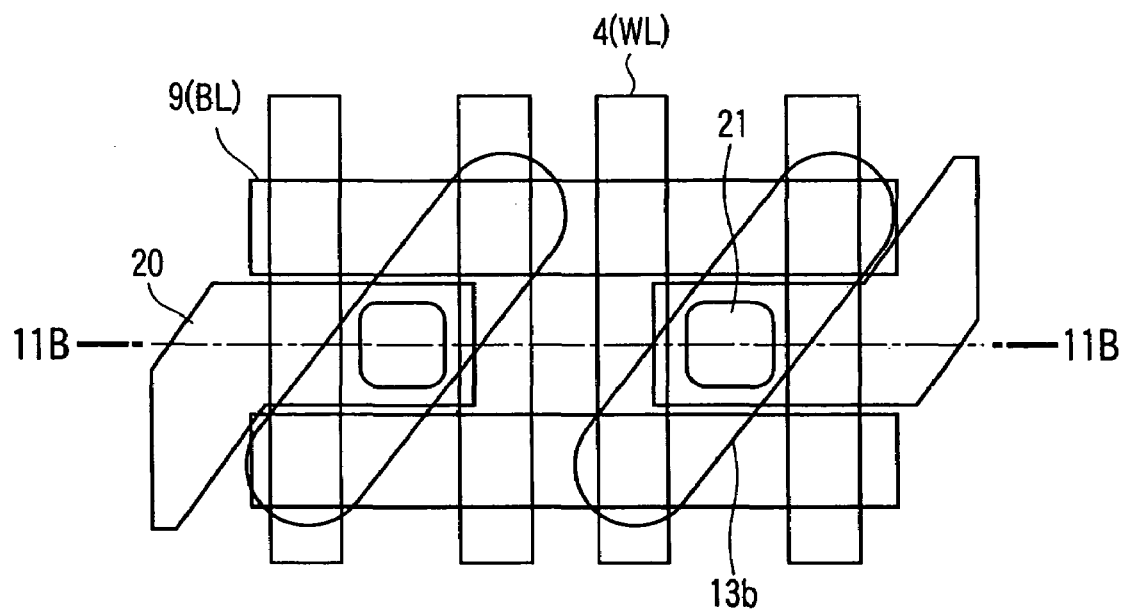
FIG. 11A and FIG. 11B are views schematically showing part of the process of manufacturing a semiconductor device according to a third embodiment of the present invention.
Figure 11B:
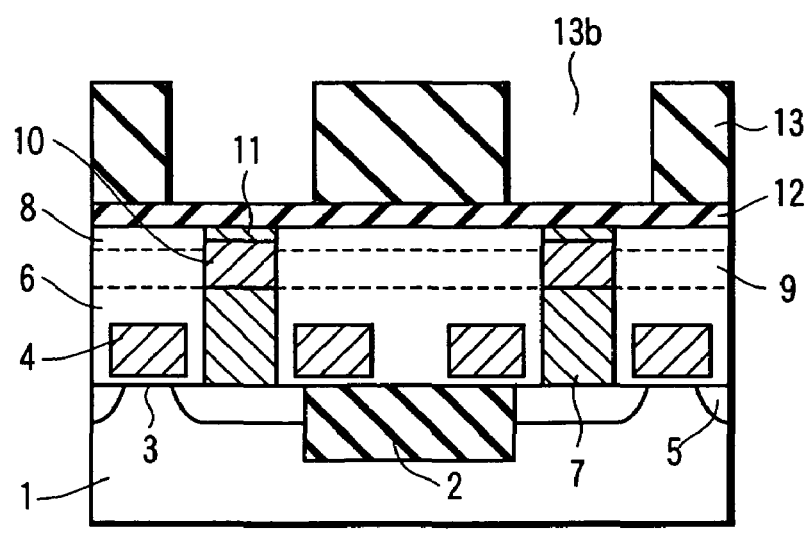

As shown in FIG. 11A and FIG. 11B, a silicon nitride film 12 having a thickness of about 50 nm is formed on the entire surface, and further, a plasma TEOS oxide film 13 is deposited to about 400 nm. The TEOS oxide film 13 is etched by RIE using a resist pattern (not shown) as a mask. In this case, etching is carried out to stop at the silicon nitride film 12. By doing so, a trench 13b is formed. The width of the trench 13b corresponds to the minimum size determined by lithography process. For example, in 50 nm generations, the width of the trench 13b is about 50 to 80 nm.

Figure 12A:
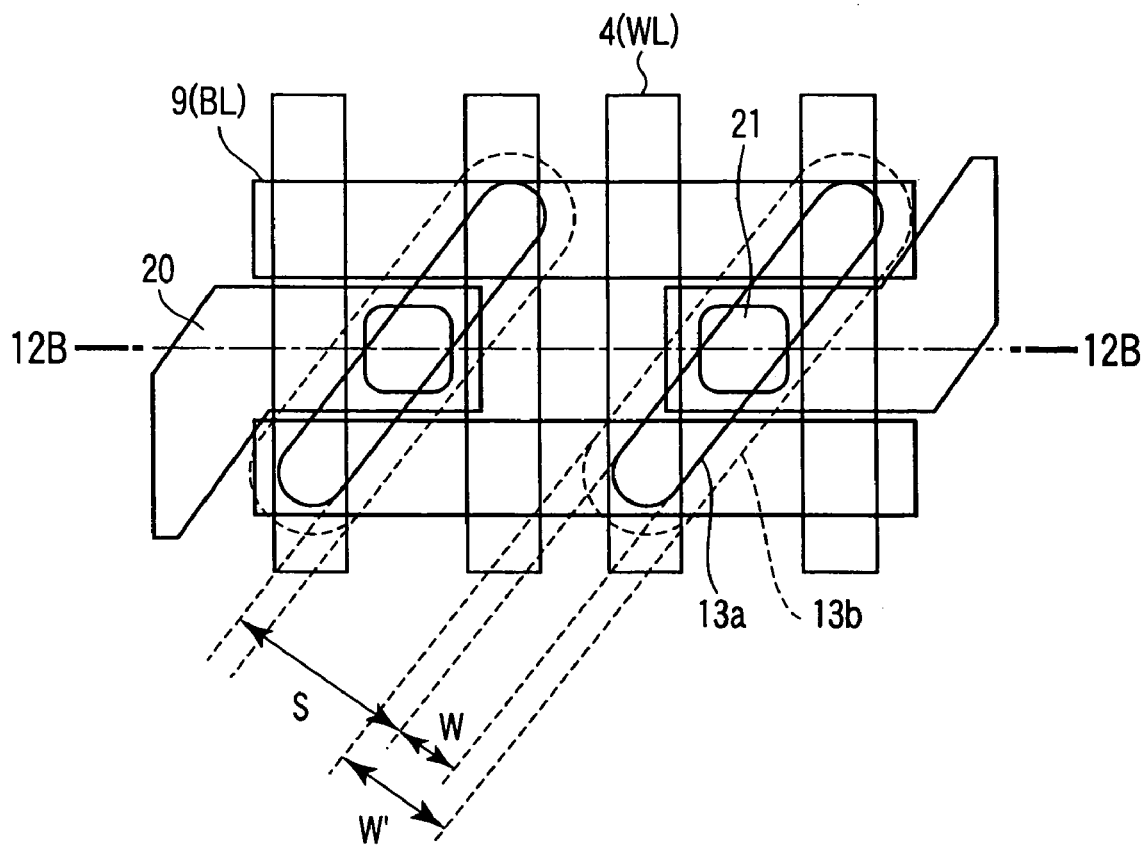
FIG. 12A and FIG. 12B are views schematically showing part of the process of manufacturing the semiconductor device according to the third embodiment of the present invention.
Figure 12B:
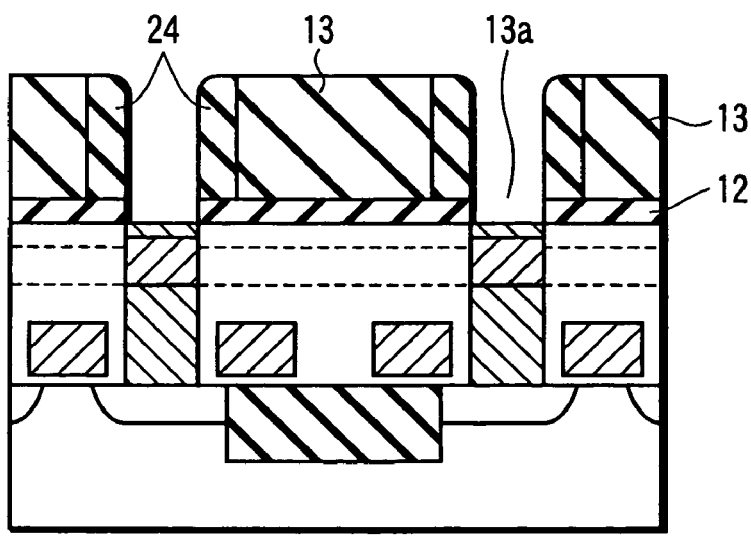

As illustrated in FIG. 12A and FIG. 12B, a silicon oxide film ($SiO_2$ film) 24 is deposited on the entire surface by CVD. The silicon oxide film 24 is etched by anisotropic etching such as RIE. By doing so, a sidewall film 24 is formed on the side surface of the TEOS oxide film 13, that is, the side surface of the trench 13b. As a result, as seen from FIG. 12A, the width of the trench 13b is reduced from W' to W. For example, the width of the trench 13b is reduced from 60 nm (W') to 30 nm (W). In this case, the silicon oxide film is deposited to a thickness of about 15 nm, and the sidewall film 24 is formed on the side surface of the TEOS oxide film 13 by anisotropic etching. Thereafter, the silicon nitride film 12 is etched so that the surface of the barrier metal film 11 can be exposed.

The process after that is basically the same as the first embodiment. That is, the Ru film, etc. are buried in the trench 13b so that the SN electrode 14 can be formed, and thereafter, the TEOS oxide film 13 and the sidewall film 24 are removed by etching. The dielectric film 15 and the plate electrode are formed to cover the SN electrode 14, thereby obtaining the capacitor structure like the structure shown in FIG. 1B.

According to the embodiment, the sidewall film 24 is formed on the side surface of the trench by anisotropic etching, and thereby, the trench width is reduced. Therefore, the width W of the SN electrode formed in the trench can be made narrower than the minimum size determined by lithography. As a result, the distance (space width S) between SN electrodes can be made wider than the width W of the SN electrode, as seen from FIG. 12A. That is, the width W of the SN electrode is made narrower than the minimum size determined by the design rule and the space width S is made wider than the minimum size determined by the design rule. Therefore, even if the memory cell is reduced, it is possible to securely form the dielectric film and the plate electrode in the space between SN electrodes, like the first embodiment. As a result, the capacitor can secure high reliability and performance. In addition, the thickness of the sidewall film is properly controlled, and thereby, the width of the SN electrode and the space width between SN electrodes can be optimized.

In the embodiment, the SN electrode is inclined in the extending direction of the bit line, like the first embodiment. The method of the embodiment is applicable to the case where the longitudinal direction of the SN electrode is parallel to the extending direction of the bit line, like the second embodiment.

(Fourth Embodiment)

The process of manufacturing in a semiconductor device (stacked DRAM) according to a fourth embodiment of the present invention will be described below with reference to FIG. 13A and FIG. 13B to FIG. 14A and FIG. 14B. The semiconductor device of the fourth embodiment has basically the same structure as the first embodiment. Identical reference numerals are used to designate elements corresponding to those described in the first embodiment, and the details are omitted. In addition, the process of manufacturing the semiconductor device is basically the same as the first embodiment; therefore, the details are given by referring to the first embodiment. The particular process according to the second embodiment will be mainly described herein.

The process up to the formation of the barrier metal film 11 is carried out like the process described in FIG. 2A and FIG. 2B of the first embodiment.

As shown in FIG. 13A and FIG. 13B, the silicon nitride film 12 having a thickness of about 50 nm is formed on the entire surface, and further, the plasma TEOS oxide film 13 is deposited to about 400 nm. Then, the TEOS oxide film 13 and the silicon nitride film 12 are etched by RIE using a resist pattern (not shown) as a mask to form a trench 13c. A metal film (e.g., Ru film) 14' having a thickness of about 20 nm is deposited on the entire surface by CVD. The metal film is etched by anisotropic etching such as RIE, and thereby, a fence-shaped sidewall metal film 14' is formed on the side surface of the TEOS oxide film 13, that is, the side surface of the trench 13c.

As illustrated in FIG. 14A and FIG. 14B, the TEOS oxide film 13 and the silicon nitride film 12 are removed by etching. Thereafter, the fence-shaped sidewall metal film 14' is etched by RIE using a resist pattern 25 as a mask so that sidewall metal film 14' can be divided. The SN electrode 14 is formed in the manner described above.

The process after this is basically the same as the first embodiment. That is, the dielectric film 15 and the plate electrode 16 are formed to cover the SN electrode 14, thus obtaining a capacitor structure.

According to the embodiment, the sidewall metal film (SN electrode) is formed on the side surface of the trench by anisotropic etching. Therefore, the width of the SN electrode can be less than the minimum size determined by lithography. Consequently, the distance (space width S) of SN electrodes is set wider than the width W of the SN electrode. That is, the width W of the SN electrode is made narrower than the minimum size determined by the design rule and the space width S is made wider than the minimum size determined by the design rule. Therefore, even if the memory cell is reduced, it is possible to securely form the dielectric film and the PL electrode in the space between SN electrodes, like the first embodiment. As a result, the capacitor can secure high reliability and performance. In addition, the thickness of the sidewall film is properly controlled, and thereby, the width of the SN electrode and the space width between SN electrodes can be optimized.

After the process of FIG. 14A and FIG. 14B, for example, hydrogen annealing may be carried out at the temperature of 600° C. for 30 minutes. By doing so, the edge of the SN electrode can be made round as shown in FIG. 15.

In the embodiment, the SN electrode is inclined in the extending direction of the bit line, like the first embodiment. The method of the embodiment is applicable to the case where the longitudinal direction of the SN electrode is parallel to the extending direction of the bit line like the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming a first film on a substrate including a bit line extending in a first direction and a plurality of transistors electrically connected to the bit line;

patterning the first film to form a plurality of trenches;

forming second films on side surfaces of the trenches to narrow the trenches;

forming, in the narrowed trenches, a plurality of first electrodes arranged in the first direction and electrically connected to the transistors;

removing the first film and the second films;

forming a dielectric film covering upper and side surfaces of the first electrodes; and forming a second electrode covering the dielectric film.

2. The method according to claim 1, wherein forming the second films on the side surfaces of the trenches is carried out using anisotropic etching.

3. The method according to claim 1, wherein a width of the first electrode is smaller than a distance between adjacent first electrodes.

4. The method according to claim 1, wherein the semiconductor device is a semiconductor memory.

5. The method according to claim 1, wherein the semiconductor device is a random access memory.

6. A method of manufacturing a semiconductor device, comprising:

forming a first film on a substrate including a bit line extending in a first direction and a plurality of transistors electrically connected to the bit line;

patterning the first film to form a plurality of trenches;

forming second films made of conductive material on side surfaces of the trenches;

removing the first film;

patterning the second films to form a plurality of first electrodes arranged in the first direction and electrically connected to the transistors;

forming a dielectric film covering upper and side surfaces of the first electrodes; and forming a second electrode covering the dielectric film.

7. The method according to claim 6, wherein forming the second films on the side surfaces of the trenches is carried out using anisotropic etching.

8. The method according to claim 6, wherein a width of the first electrode is smaller than a distance between adjacent first electrodes.

9. The method according to claim 6, wherein the semiconductor device is a semiconductor memory.

10. The method according to claim 6, wherein the semiconductor device is a random access memory.

* * * * *